US006392893B1

(12) United States Patent
Carney et al.

(10) Patent No.: US 6,392,893 B1
(45) Date of Patent: May 21, 2002

(54) HOT SWAP FAN MOUNTING SUPPORT BRACKET

(75) Inventors: James M. Carney, Pepperell; Robert S. Antonuccio, Burlington; Timothy M. Holland, West Boylston, all of MA (US); Daniel D. Gonsalves, Hudson, NH (US); Joseph J. Montagna, Acton, MA (US)

(73) Assignee: Sun Microsystems, Inc., Palo, Alto, CA (US)

( * ) Notice: Subject to any disclaimer, the term of this patent is extended or adjusted under 35 U.S.C. 154(b) by 0 days.

(21) Appl. No.: 09/708,355

(22) Filed: Nov. 8, 2000

(51) Int. Cl.[7] .................................................. H05K 7/14
(52) U.S. Cl. ........................... 361/727; 361/679; 439/59
(58) Field of Search ................................. 361/724–728, 361/679–686, 730, 687, 736, 741, 695, 752, 756, 788, 796, 797, 802, 803; 439/59, 61; 364/708.1

(56) References Cited

U.S. PATENT DOCUMENTS 4,998,767 A * 3/1991 Lawassani et al. ........ 296/97.1
5,398,161 A * 3/1995 Roy ............................ 361/727
6,115,250 A * 9/2000 Schmitt ....................... 361/695

* cited by examiner

Primary Examiner—Darren Schuberg
Assistant Examiner—Hung Van Duong
(74) Attorney, Agent, or Firm—Lahive & Cockfield, LLP

(57) ABSTRACT

A method and apparatus relating to a support bracket (18) enabling hot-swapping of component trays (16) in component racks (10) is disclosed. A bracket (18) is provided for removably mounting a tray (16) in a component rack (10). The bracket (18) has two guide channels (20) extending substantially from a front end of the bracket (18) through to a back end. The guide channel (20) is adapted for sliding engagement with the component carrying tray (16). In addition, there is at least one stop guide (30) that projects from each of the front and back ends of the bracket (18). This stop guide (30) aids in positioning the bracket (18) during installation. On a backside of the bracket (18), there is a detent (32) that projects outward. The detent (32) serves as an aid in positioning and releasably holding the bracket (18) in place during installation. The configuration of the bracket (18) allows it to be used as either a bottom bracket (18) or a top bracket (18) for mounting a tray (16), without any additional modifications.

22 Claims, 3 Drawing Sheets

HOT SWAP FAN MOUNTING SUPPORT BRACKET

FIELD OF THE INVENTION

The invention relates to assemblies for removably mounting component trays in a rack storage system and more particularly to removably mounting fan trays more easily and efficiently without having to shut down surrounding components.

BACKGROUND OF THE INVENTION

Users of computer equipment are increasingly demanding that the equipment be easily accessible and replaceable. Often times, equipment is placed on trays to facilitate easy removal and replacement. As computer equipment often performs critical tasks, it is desirable to not have to power down the equipment to perform maintenance and replacement tasks. This ability is known as "hot-swapping," and is a desirable feature in current systems.

The trays that are used to slidably mount the equipment must be supported by brackets that allow the trays to slide in and out of the computer racks. In the past, the brackets have been single structures extending from an upper location, down to a lower location. It is desirable not to have a large, cumbersome structure making up these brackets that takes up space, requires more material to make, and is cumbersome to use.

SUMMARY

For the foregoing reasons, there exists in the art a need for support brackets for removably mounting fan trays and other component carrying trays in a manner that enables hot swapping and promotes better efficiency. In accordance with one example embodiment of the present invention, a bracket is provided for removably mounting a tray in a component rack. The bracket has at least one guide channel extending substantially from a front end of the bracket through to a back end. The guide channel is adapted for sliding engagement with the component carrying tray. In addition, there is at least one stop guide that projects from each of the front and back ends of the bracket. This stop guide aids in positioning the bracket during bracket installation. On a backside of the bracket, (the side opposite a tray-facing side), there is a detent that projects outward from the bracket. The detent serves as an aid in positioning and releasably holding the bracket in place while the bracket is being installed. The configuration of the bracket allows it to be used as either a bottom bracket or a top bracket for mounting a tray, without having to additionally modify the bracket.

In accordance with another example embodiment of the present invention, the guide channel contained within the bracket includes at least one raised runner. The runner or runners are positioned along a base portion of the guide channel, and extend from one end of the channel to the other. They serve to decrease frictional resistance when a tray is being inserted, and also decrease static charge build-up.

In accordance with yet another example embodiment of the present invention, the bracket includes a plurality of threaded inserts embedded in each of the front and back ends of the bracket. These threaded inserts are utilized in anchoring the bracket to the tray with threaded fasteners.

In accordance with still another example embodiment of the present invention, the bracket contains a plurality of through holes. The through holes are positioned in various locations along the base of the guide channel. Fasteners are inserted through each of the holes to mount the bracket into a desired component rack.

It should be noted that other example embodiments can include a bracket having two or more guide channels. The channels in such instances run substantially parallel to each other and extend from the front end through to the back end of the bracket. Each of the guide channels include at least one raised runner following along the base of each of the channels.

BRIEF DESCRIPTION OF THE DRAWINGS

The aforementioned features and advantages, and other features and aspects of the present invention, will become better understood with regard to the following description and accompanying drawings, wherein.

DETAILED DESCRIPTION

Figure 1:
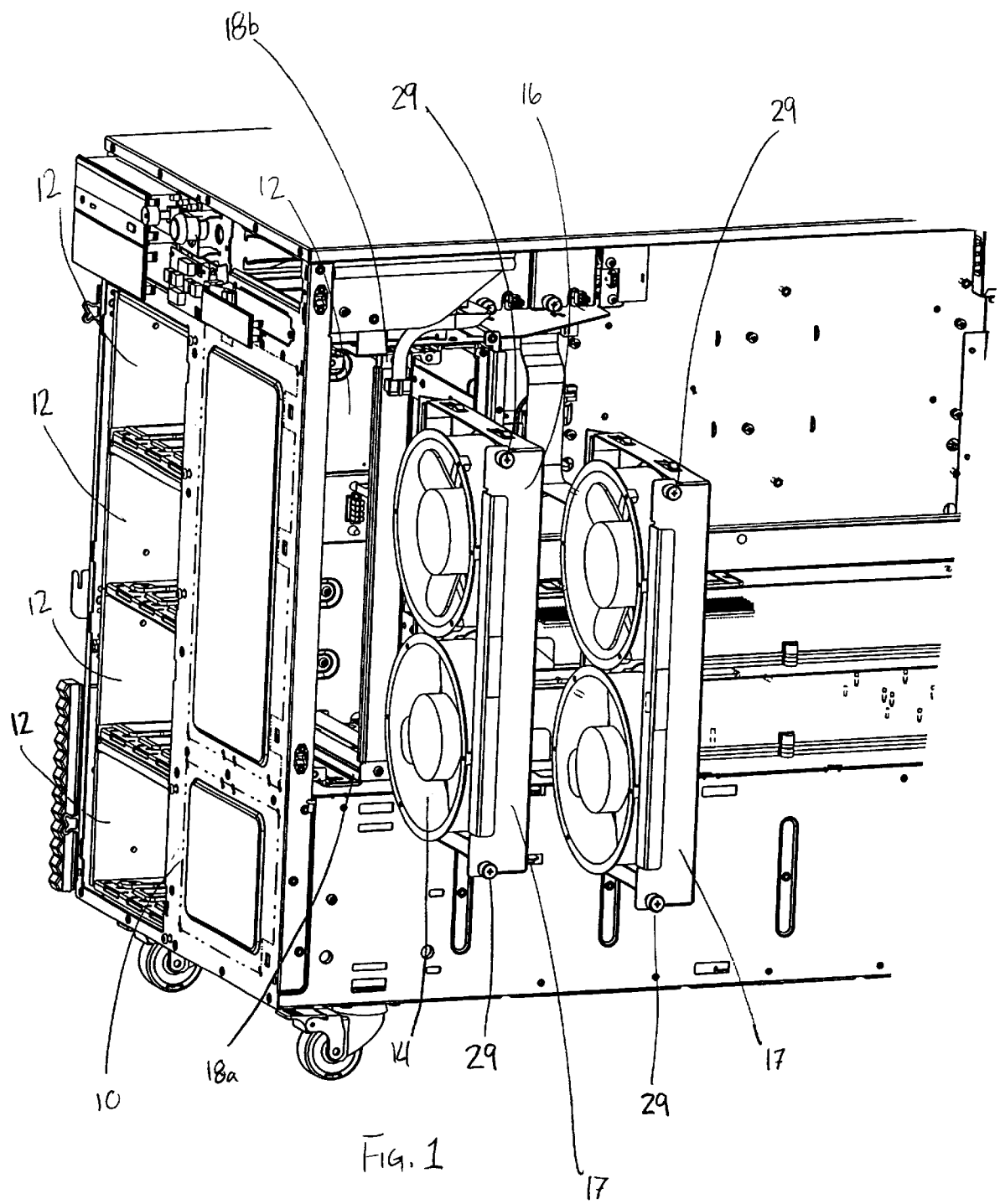
FIG. 1 is a perspective view of a computer component rack with multiple brackets installed, according to one embodiment of the present invention.

In general, the present invention includes a bracket for removably mounting a tray, such as a fan tray, in a computer component rack. The bracket includes various structural aids to help in installing the bracket in the component rack. The bracket is structurally symmetrical such that a first bracket can be utilized in a bottom location and an identical copy of the first bracket can be utilized as a second bracket in a top location. Each of the brackets includes a channel along which a tray slides to ultimately be held in place by the brackets. The channels include raised runners along the base of the channel that help to reduce the frictional resistance on the trays as they are inserted, as well as reduce static charge build-up.

The present invention generally relates to a bracket 18 for removably mounting a tray 16 in a component rack 10. The bracket 18 includes at least one (in a particular embodiment, two) guide channels 20. Most often, the bracket 18 is mounted in two locations, one at either end (e.g., top and bottom interior walls) of a compartment 12 in which it is desirable for a computer component tray 16 to be slidably mounted. The bracket 18 is designed to fit in opposite positions to other like brackets 18 within a compartment 12 with a mere flip and/or rotation for proper orientation at installation, but without any further modifications. The guide channels 20 include raised runners 22, which reduce frictional resistance during the insertion of a tray 16 into the bracket 18, and also cut down on static charge build-up. The guide channels 20 support a component carrying tray 16 after being slid into the brackets 18, and promote the installation and removal of a computer component tray 16 into a component rack 10 with greater efficiency and ease of use.

Figure 2:
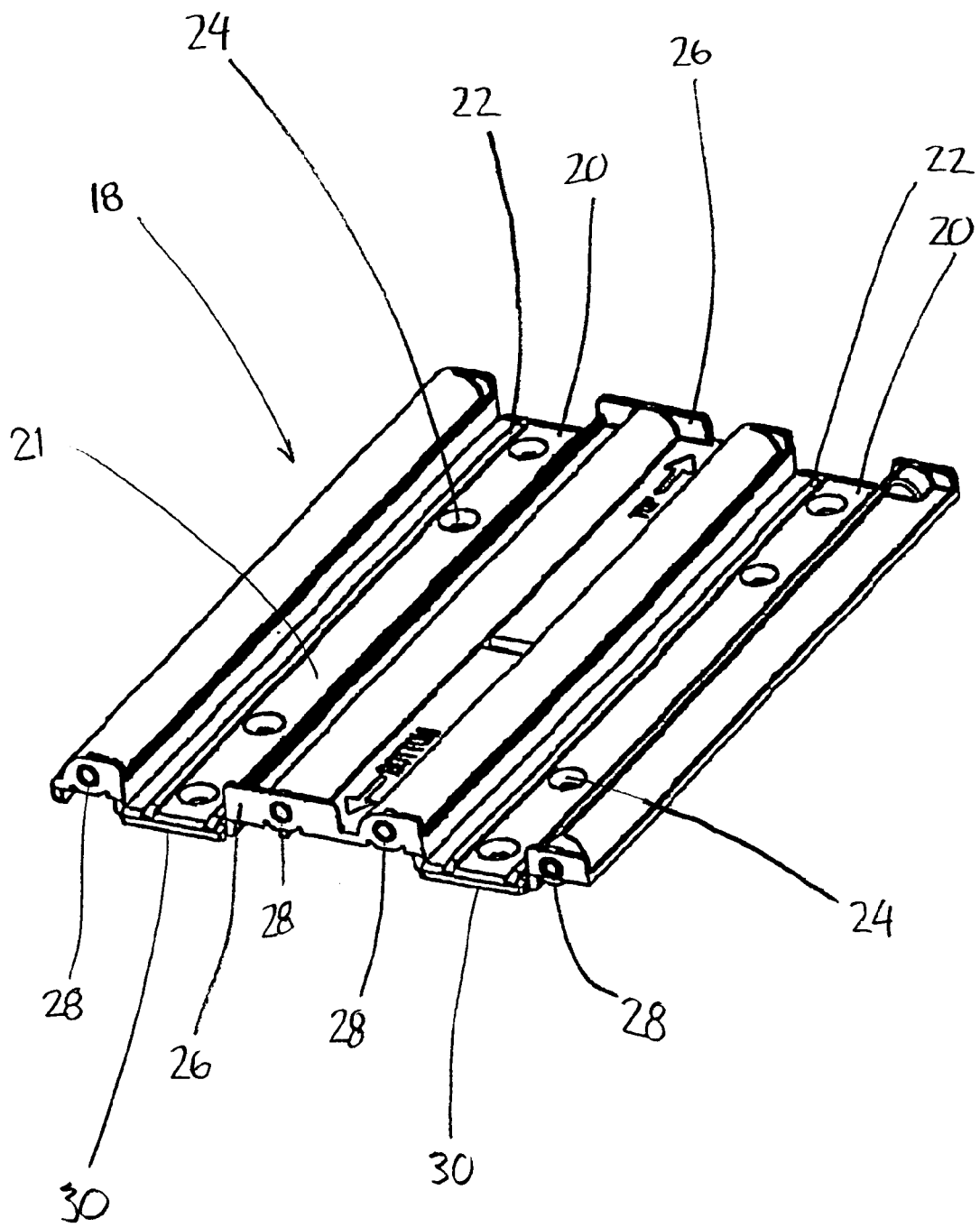
FIG. 2 is a perspective view of a tray-facing side of a bracket according to one embodiment of the present invention.
Figure 3:
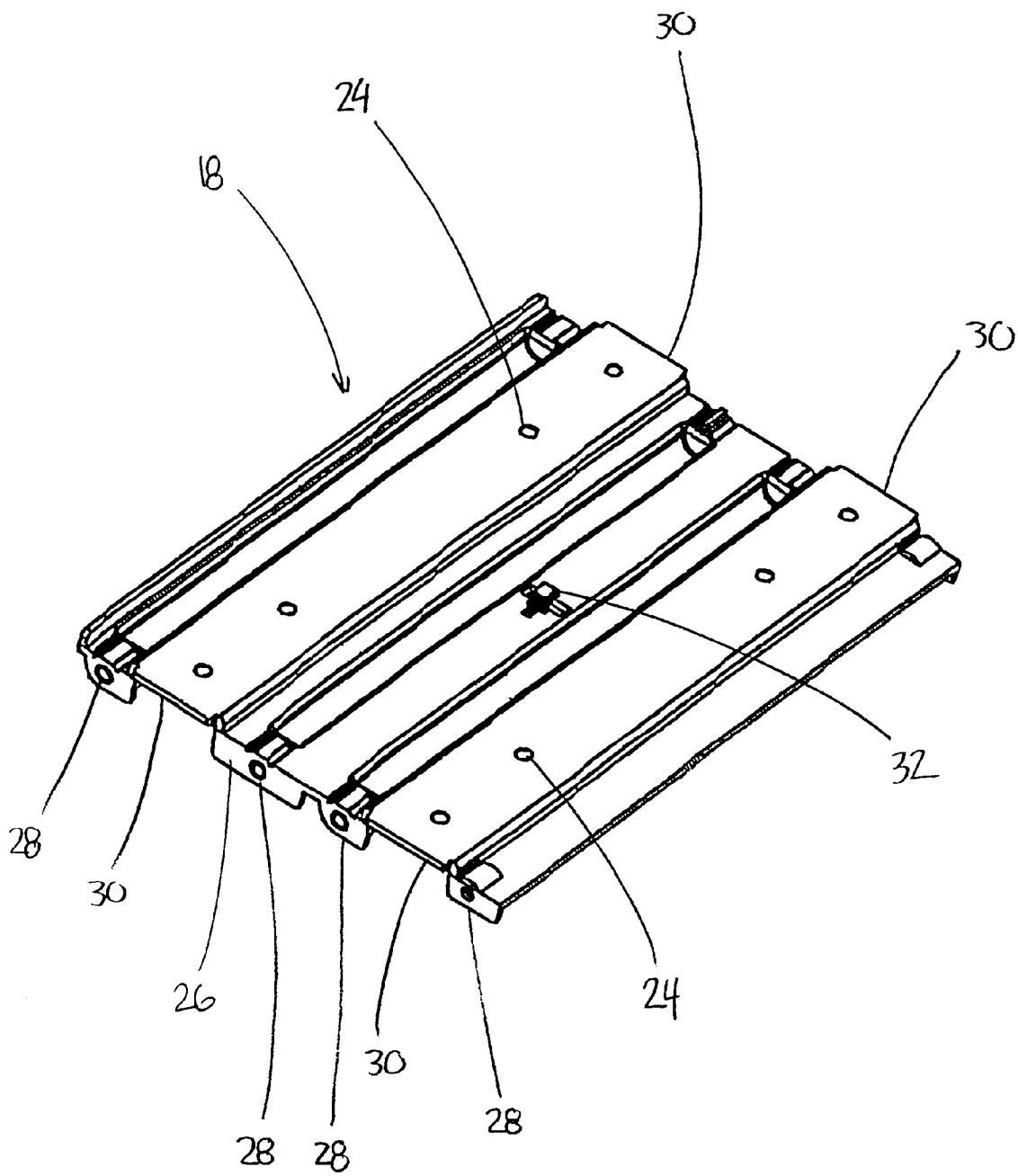
FIG. 3 is a perspective view of a back side of the bracket according to one embodiment of the present invention.

Referring now in detail to the drawings wherein like parts are designated by like reference numerals throughout, FIGS. 1–3 illustrate example embodiments of a bracket 18 for removably mounting a tray 16 in a component rack 10 according to the present invention. Although the present invention will be described with reference to the example embodiments illustrated in the figures, it should be noted that the present invention can be embodied in many alternative forms. In addition, any suitable size, shape, or type of elements or materials can be utilized.

In general, the computer component rack 10, is a large rectangular structure. The rack shown in FIG. 1 is merely an example of the type of structure or framework in which the present invention bracket 18 may be installed. Typically, each component rack 10 includes within it several compartments 12. These compartments 12, provide space for the mounting of various component trays 16 containing within them various components 14. Each component 14 can be computer-related hardware, a fan, a group of fans, a data storage device, or other electronic media.

According to one embodiment of the present invention a fan assembly 17 makes up the particular component 14 within the component tray 16. Fan assembly 17 mounts within component tray 16, which is removably mountable within a compartment 12 of the component rack 10 by means of mounting brackets 18. The brackets 18 are mounted within component rack 10 in a manner that will be further discussed at a later point herein.

The brackets 18 discussed herein can be used to mount fan assemblies 17 or other types of components and component trays. However, the present invention works particularly well with the fan assembly 17 illustrated herein. Further, the fan assembly 17 illustrated shows two fans. However, the fan assembly can include any number of fans or other components and the fans or components can have alternate designs or configurations, as desired.

In a broadest sense of the invention, only one bracket 18 is necessary to support a component tray 16. When only one bracket 18 is used, the bracket 18 installs in a compartment 12 of a component rack 10 in a bottom location, tray-side facing where the component tray 16 will ultimately be inserted, such that the component tray 16 can slide into the guide channel 20 and be held in place.

However, the component tray 16 is better supported if two brackets 18a, 18b are utilized in conjunction with each other. In such an instance, a first bracket 18a mounts in the bottom location of the compartment 12. Subsequently, a second bracket 18b mounts in a top location of compartment 12. The bracket 18b is identical in shape, configuration, and structure to the first bracket 18a mounted in the bottom location. However, the second bracket 18b is flipped, such that the tray side again faces the direction of where the component tray 16 will ultimately be inserted, causing the channels 20 to face an interior of the compartment 12. A detent 32 (see FIG. 3) is useful in the installation of the bracket 18 in several instances, especially in the top location bracket 18b as will be discussed at a later point herein.

It should be noted that the installation illustrated herein shows bottom and top brackets 18a, 18b, but the installation can position a bracket 18 on each of a left interior wall and a right interior wall of a compartment 12, or even front and back interior compartment 12 walls. The bracket 18 can function alone, or in conjunction with another like bracket 18 in a location opposite, and facing, the first. It does not necessarily matter where the pair of brackets 18 are positioned relative to the interior of the compartment 12 itself.

Once the top and bottom brackets 18a, 18b mount into the compartment 12 of the desired component rack 10, the user may then proceed with the installation of a component tray 16.

As illustrated in FIGS. 1 and 2, the brackets 18 each secure within the compartment 12 by means of threaded fasteners 23, (e.g., screws), inserted into through holes 24.

Each of the through holes 24 include the feature of a recessed rim, which allows the threaded fasteners 23 to screw into the component rack 10 to a point where the heads of the threaded fasteners 23 are substantially flush with the surface of the guide channel 20.

FIG. 2 further illustrates an isolated view of the bracket 18 according to one embodiment of the present invention. In this example, the bracket 18 includes two guide channels 20. The number of guide channels 20 can vary depending upon the particular application or desire. The shape of the guide channels 20 can also vary. In this embodiment, the guide channels 20 are formed by three relatively planar, straight, sides. Alternatively, the sides of the guide channels can be non-planar, curved, have peaks and valleys, include surface features such as gripping detents, etc. Further, the sides do not need to be solid. The guide channel 20 surfaces can be perforated, meshed, grided, contain substantial apertures, etc. for manufacturing and performance advantages, as desired. There can also be springing clamps, or mounts, extending from a guide channel 20 surface that apply pressure and frictional force to the trays 16 to better hold them in place.

A pair of raised runners 22 follows along a base 21 of each guide channel 20 in the illustrated embodiment. The runners 22 extend from one end of each guide channel 20 to the other. In one example instance, the runners 22 had dimensions of 0.03 inches high and 0.10 inches wide. It should be noted that these runners 22 can be of greater or lesser number, and can be on other surface locations of the guide channels 20. Further, the runners 22 can be of a different material, such as, e.g., Teflon®, metal, composite, or other plastic. These raised runners 22 serve several purposes. As the component tray 16 (e.g., fan assembly 17) inserts into the bracket 18, it slides along only the surface of each raised runner 22. This raises the component tray 16 off of the base 21 of the guide channel 20 thus reducing the risk of the component tray 16 catching on any threaded fasteners 23 that were poorly fitting fasteners or may not have been completely or properly screwed into the bracket 18 and component rack 10. Further the raised runner 22 surface area is far less than that of the entire guide channel 20 itself. In turn, the contact surface area between the raised runners 20 and the component tray 16 is less, which provides for lower frictional resistance on the component tray 16 as it slides into the bracket 18. A further advantage is that with less frictional resistance, there is a reduced amount of static charge build-up. Static charges can be detrimental to the types of computer components 14 stored within the trays 16, and thus there is commonly a desire to reduce such build-ups.

The bracket 18 shown includes four through holes 24 along each guide channel 20 base 21. When mounting the bracket 18 to the compartment 12 of the component rack 10, often threaded, or other type, fasteners (not shown) insert into these through holes 24 to mount the bracket 18 in place. Of course, the number of through holes 24 can vary from one to a plurality. Each through hole 24 has a recessed beveled edge which makes it possible to screw a screw further down, essentially until a top most portion of the screw head is flush with the base 21 of the guide channel 20. This reduces the risk of a tray 16 edge being caught on a fastener while sliding into the component rack 10.

There are raised edges 26 along a front portion and a back portion of the bracket 18. The raised edges 26 contain a plurality of ultrasonically installed threaded inserts 28. The raised edges 26 help to inhibit a user from inserting a component tray 16 too far into each guide channel 20. Once a component tray 16 fully inserts into the guide channel 20, threaded fasteners 29 screw into each of the threaded inserts 28 to hold the particular component tray 16 in place. The raised edges 26 may be of almost any desired shape, length, extension, etc., and serve the same function.

As illustrated in FIG. 3, bracket 18 also includes several stop guides 30 and the detent 32. The stop guides 30 help to position the bracket 18 upon initial installation into the compartment 12 of the component rack 10. There are stop guides 30 on each end of the bracket 18, which contribute to the ability of the bracket 18 to mount in a bottom location, or flip and install in a top location. The stop guides 30 illustrated are merely extensions of the base 21 of the guide channels 20. However, the stop guides can be at any location outside of each end of the bracket 18. Their main purpose is to interfere with a back wall of the compartment 12 in which the bracket 18 is installed, at a time when the bracket 18 is in the desired position. They can be of numerous shapes, e.g., posts, blocks, spheres, half-spheres, arms, or any other shape that will effectively signal to an installer that the bracket 18 is in the proper location upon installation.

The detent 32 is useful in releasably positioning the bracket 18 when mounted in, e.g., a top position. As shown, the detent 32 has a hook-like (e.g., an upside-down "L" shape) structure. However, the detent 32 can also vary in shape, size, and location. With regard to shape, the functionality of the detent 32 is what is desired. The detent 32, in an example embodiment, is located on the posterior, or back side of the second bracket 18b. This shape helps to releasably mount the top bracket in position prior to installation of the threaded fasteners through the through holes 24. The user lines up the detent 32 with an aperture located in the top portion of the compartment 12 (see FIG. 1), and inserts the detent 32 through the aperture (not shown) such that the detent 32 supports the rate of the bracket 18b in the proper position for final mounting. As an alternative to an aperture, another hook, or post, etc., can mate with the detent 32. The threaded fasteners then screw into the through holes 24 of the bracket 18b mounting it in place. The detent 32 allows a bracket 18 installer to "hang" the bracket 18 in an upper interior wall of a compartment 12, holding the bracket 18 in position as fasteners are inserted to mount the bracket 18 in place. The size and location of the detent 32 rely upon the size and location of the particular aperture or hook in the compartment 12 upon which the detent 32 hangs during installation of the bracket 18. These elements must align, when the bracket is in the proper position, to serve their purpose.

Bracket 18 is preferably made of a resilient structural plastic, such as PC/ABS plastic. Typically the bracket 18 is manufactured using a standard injection molding process. Other materials and manfucturing techniques known to one skilled in the art can be employed in producing the bracket 18 of the present invention.

Having described the apparatus of the present invention, and with reference to FIGS. 1–3, the method of guiding and removably mounting a computer component tray 16 containing a component 14 in a component rack 10 can be set forth. The method begins with the step of sliding a first edge of a component tray 16, such as fan assembly 17, along one of the guide channels 20 in the bottom rack 18a. The component tray 16 then rotates upward such that a top edge of the component tray 16 comes into contact with the opposing guide channel 20 in the top bracket 18b. If the user desires, the component tray 16 can be inserted into both brackets 18a, 18b, simultaneously, or into the top bracket 18b first.

Next the user slides the component tray 16 toward the back of the compartment 12 along the guide channels 20 of the top and bottom brackets 18a, 18b. Once the component tray 16 reaches a back portion of the compartment 12, and a front portion of the component tray 16 meets with the raised edges 26, the user knows that the component tray 16 has been fully inserted. At such time, if desired, the user may insert threaded fasteners 29 through apertures on the component tray 16 and into the threaded inserts 28 along the raised edges 26 of each of the top and bottom brackets 18a, 18b to secure the component tray 16 in place.

Typically a plug-connector, e.g., made by Molex, Inc. (not shown), makes the electrical connection between the particular component tray 16 and the component rack 10. The connector could be of the type, for example, serial, parallel, or USB. As the component tray 16 slides into the component rack 10, the male and female portions of the particular plug configuration are lined up and eventually mate once the component tray 16 is fully stowed. Alternatively, a connection could be made with a cord or other extended plug independent of the stowing of the component tray 16.

Numerous modifications and alternative embodiments of the invention will be apparent to those skilled in the art in view of the foregoing description. Accordingly, this description is to be construed as illustrative only and is for the purpose of teaching those skilled in the art the best mode for carrying out the invention. Details of the structure may vary substantially without departing from the spirit of the invention, and exclusive use of all modifications that come within the scope of the appended claims is reserved. It is intended that the invention be limited only to the extent required by the appended claims and the applicable rules of law.

What is claimed is:

1. A bracket for removably mounting a tray in a component rack, comprising:
   at least one guide channel extending substantially from a front end through to a back end of said bracket, said guide channel adapted for sliding engagement with said tray;
   at least one stop guide projecting from each of said front and back ends of said bracket to aid in positioning said bracket;
   a detent projecting outward from a posterior side of said bracket to aid in positioning and releasably holding said bracket in place during bracket installation; and,
   wherein said at least one guide channel, at least one stop guide, and detent are symmetrical such that substantially identical copies of said bracket can be used as opposing brackets for mounting said tray, without structural modification to said opposing brackets.

2. The bracket according to claim 1, wherein said guide channel includes at least one raised runner positioned on a tray-facing surface of said guide channel.

3. The bracket according to claim 1, further comprising at least one threaded insert imbedded at a front end and at a back end of said bracket for anchoring said tray to said bracket with a fastener.

4. The bracket according to claim 1, further comprising a plurality of threaded inserts imbedded at each of said front and back ends for anchoring said tray to said bracket with threaded fasteners.

5. The bracket according to claim 1, further comprising at least one through-hole positioned along said guide channel for use in conjunction with at least one fastener in mounting said bracket to said component rack.

6. The bracket according to claim 1, further comprising a plurality of through-holes positioned along said guide channel for use in conjunction with fasteners in mounting said bracket to said component rack.

7. The bracket according to claim 1, wherein said bracket has two guide channels, substantially parallel to each other and both extending substantially from said front end through to said back end of said bracket.

8. The bracket according to claim 2, wherein said guide channel includes at least one raised runner positioned on a base of said guide channel.

9. The bracket according to claim 7, wherein each of said two guide channels includes at least one raised runner positioned along a tray-facing portion of said guide channel.

10. The bracket according to claim 7, wherein each of said two guide channels includes at least one raised runner positioned along a base of said guide channel.

11. An assembly for mounting a tray in a component rack, comprising:

first and second substantially identical brackets each having at least one guide channel extending substantially from a front end through to a back end of said bracket, at least one stop guide projecting from each of said front and back ends of said brackets, and a detent projecting from a posterior side of said brackets; and wherein said first bracket is mounted to said component rack in a first location and said second bracket is mounted to said component rack in a substantially parallel, inverted, and opposing position relative to said first bracket and in a second location, such that there exists sufficient space between said first and second brackets for said tray to slide along and be supported by each of said at least one guide channels and between each of said brackets.

12. The assembly according to claim 11, wherein said at least one guide channel includes at least one raised runner positioned along a base of said at least one guide channel.

13. The assembly according to claim 11, further comprising at least one threaded insert imbedded at each of said front and back ends of said bracket for anchoring each of said brackets to said tray with a fastener.

14. The assembly according to claim 11, further comprising a plurality of threaded inserts imbedded at each of said front and back ends for anchoring each of said brackets to said tray with fasteners.

15. The assembly according to claim 11, further comprising at least one through-hole positioned along each of said at least one guide channels for use in conjunction with fasteners in mounting each of said brackets to said component rack.

16. The assembly according to claim 11, further comprising a plurality of through-holes positioned along each of said at least one guide channels for use in conjunction with fasteners in mounting each of said brackets to said component rack.

17. The assembly according to claim 11, wherein each of said first and second brackets has two guide channels, substantially parallel to each other and both extending substantially from said front end through to said back end of each of said brackets.

18. The assembly according to claim 17, wherein each of said two guide channels includes at least one raised runner positioned along a base.

19. A method of mounting at least one bracket, said method comprising the steps of:

providing said at least one bracket having at least one guide channel extending substantially from a front end through to a back end of said at least one bracket, at least one stop guide projecting from each of said front and back ends of said at least one bracket, and a detent projecting from a posterior side of said at least one bracket in a component rack compartment;

setting said at least one bracket in said compartment;

sliding said at least one bracket further into said compartment until a stop guide prevents further sliding motion; and inserting at least one fastener through at least one through-hole in said at least one bracket to mount said at least one bracket in place.

20. The method according to claim 19, wherein an additional step of releasably hooking said first bracket by a detent on said first bracket, on an interior portion of said compartment occurs approximately simultaneously with said sliding step.

21. The method according to claim 19, further comprising the steps of setting a second of said at least one brackets in said compartment, sliding said second bracket further into said compartment until a stop guide prevents further sliding motion, and inserting at least one fastener through at least one through-hole in said second bracket to mount said second bracket in place.

22. The method according to claim 21, wherein an additional step of releasably hooking said second bracket by a detent on said second bracket, on an interior portion of said compartment occurs approximately simultaneously with said sliding step.

* * * * *